(12) United States Patent
Friz et al.

(10) Patent No.: US 7,790,289 B2
(45) Date of Patent: Sep. 7, 2010

(54) EVAPORATION MATERIAL FOR THE PRODUCTION OF AVERAGE REFRACTIVE OPTICAL LAYERS

(75) Inventors: Martin Friz, Darmstadt (DE); Reiner Dombrowski, Hoechst (DE); Uwe Anthes, Erbach (DE)

(73) Assignee: Merck Patent GMBH, Darmstadt (DE)

( * ) Notice: Subject to any disclaimer, the term of this patent is extended or adjusted under 35 U.S.C. 154(b) by 1347 days.

(21) Appl. No.: 10/546,213

(22) PCT Filed: Jan. 28, 2004

(86) PCT No.: PCT/EP2004/000719

§ 371 (c)(1),
(2), (4) Date: Aug. 18, 2005

(87) PCT Pub. No.: WO2004/074206

PCT Pub. Date: Sep. 2, 2004

(65) Prior Publication Data

US 2006/0234071 A1    Oct. 19, 2006

(30) Foreign Application Priority Data

Feb. 19, 2003    (DE)    ................. 103 07 096

(51) Int. Cl.
*B05D 3/00*    (2006.01)
*B32B 17/00*    (2006.01)

(52) U.S. Cl. .............. 428/432; 428/701; 428/702; 501/126; 501/127; 501/152; 359/642; 359/831; 359/838; 427/2.14; 427/255.37

(58) Field of Classification Search ............... None
See application file for complete search history.

(56) References Cited

U.S. PATENT DOCUMENTS

| 5,157,547 | A |   | 10/1992 | Paesold |   |
|---|---|---|---|---|---|
| 5,164,348 | A | * | 11/1992 | Wood | 501/127 |
| 5,604,396 | A | * | 2/1997 | Watanabe et al. | 313/485 |
| 6,087,014 | A |   | 7/2000 | Dombrowski |   |
| 6,327,087 | B1 |   | 12/2001 | Hashimoto |   |
| 2004/0213539 | A1 | * | 10/2004 | Anderson et al. | 385/142 |

FOREIGN PATENT DOCUMENTS

| JP |       01255151 | * 10/1989 |
| JP |    2000 171609 |   6/2000  |

OTHER PUBLICATIONS

Translation of JP-01255151.*
Patent Abstracts of Japan; vol. 2000, No. 9, Oct. 13, 2000.
Shimoda T et al: "Fabrication of Highly Ytterbium (Yb)-Doped YAG Thin Film by Pulsed Deposition" Optics Communications, North-Holland Publishing Co. Amsterdam, NL, Bd. 194, Nr. 1-3, Jul. 1, 2001.
Noden J.D.: "Gadolinium Burnable Poison for High Temperature Reactors" Nucl. Eng. Int., Bd. 18, Nr. 207, Aug. 1973.
Shimoda et al., "Fabrication of Highly Ytterbium ($Yb^{3+}$)-doped YAG Thin Film by Pulsed Laser Deposition"; Optics Communications, vol. 194 (2001), pp. 175-179.
Abstract of Article—Kimura et al., "Solid-State Synthesis of $Dy_3Al_5O_{12}$ Using $Dy_2O_3$ and $AL_2O_3$ Powders", J. Japan Inst. Metals, vol. 60, No. 3 (1996), pp. 295-300.
Noden, "Gadolinium Burnable Poison for High Temperature Reactors", Nuclear Engineering International; Aug. 1973, pp. 651-644.

* cited by examiner

*Primary Examiner*—Ling Xu
(74) *Attorney, Agent, or Firm*—Millen, White, Zelano, Branigan, P.C.

(57) ABSTRACT

The invention relates to a vapor-deposition material for the production of optical layers of medium refractive index which comprises aluminum oxide and gadolinium oxide, dysprosium oxide and/or ytterbium oxide, to a process for the preparation thereof, and to the use thereof.

17 Claims, No Drawings

EVAPORATION MATERIAL FOR THE PRODUCTION OF AVERAGE REFRACTIVE OPTICAL LAYERS

The invention relates to a vapour-deposition material for the production of optical layers of medium refractive index which comprises aluminium oxide and gadolinium oxide, dysprosium oxide and/or ytterbium oxide.

For the protection of the surfaces or in order to achieve certain optical properties, optical components are generally provided with thin coatings. These optical components include, for example, optical lenses, spectacle lenses, lenses for cameras, binoculars or for other optical instruments, beam splitters, prisms, mirrors, window panes and the like.

The coatings can be employed for the treatment of the said surfaces by hardening and/or increasing the chemical resistance to damage by mechanical, chemical or environmental influences. In many cases, the aim of such surface coatings is, however, reduced reflection, which applies in particular to spectacle lenses, camera lenses and the like. However, there are also applications in which increased reflection is desired or alternatively optical layers which have to have defined refractive indices or absorption properties, such as, for example, for the production of interference mirrors, beam splitters, heat filters or cold-light mirrors. The optimum properties of the layers are generally set by selecting suitable coating materials, various layer thicknesses and single- or multilayered structures comprising, where appropriate, different materials having different refractive indices. Thus, for example, in reflection-reducing coatings, it is possible to achieve a reduction in the reflection to less than 1% over the entire visible radiation spectrum.

It is known that the above-mentioned coating layers can be produced by the application of thin layers of different materials, in particular comprising oxides, such as $SiO_2$, $TiO_2$, $ZrO_2$, MgO, $Al_2O_3$, but also comprising fluorides, such as $MgF_2$, and mixtures of these substances.

The coating materials are selected here in accordance with the target optical properties and in accordance with the processing properties of the materials.

The coating of optical substrates is usually carried out using a high-vacuum vapour-deposition process. In this, firstly the substrate and a flask containing the vapour-deposition substance are placed in a suitable high-vacuum vapour-deposition apparatus, the apparatus is subsequently evacuated, and the vapour-deposition substance is evaporated by heating and/or electron beam bombardment, with the vapour-deposition material precipitating on the substrate surface in the form of a thin layer. Corresponding apparatuses and processes are conventional prior art.

Only a limited selection of substances is known which are suitable for the production of layers of medium refractive index, which generally have a refractive index of between 1.6 and 1.9. The starting materials employed are, for example, the oxides of aluminium, magnesium, yttrium, lanthanum and praseodymium, but also cerium fluoride, lanthanum fluoride or mixtures thereof.

However, the preferred starting material used for the production of layers of medium refractive index is aluminium oxide.

Although these materials are suitable per se for the production of layers of medium refractive index, they have a number of disadvantages which make their practical use more difficult.

Thus, these substances have, for example, high melting and boiling points, which are frequently also close together. In order to improve the usability, however, it is necessary for the starting material to be melted completely before commencement of the evaporation since only in this way can a uniform and adequate evaporation rate be ensured. This is a prerequisite for the deposition of homogeneous and uniformly thick layers.

However, magnesium oxide and yttrium oxide do not melt completely under the usual working conditions and, for example due to the sublimation tendency of yttrium oxide, are difficult to evaporate in full, meaning that the layers produced therewith generally have variations in layer thickness. With magnesium oxide and lanthanum oxide, vapour deposition is accompanied by the formation of porous layers which take up moisture and thus become unstable. In addition, MgO binds $CO_2$ from moist air in the form of carbonate. Cerium fluoride and lanthanum fluoride also form inhomogeneous layers which do not have the requisite hardness and durability.

For specific applications in which refractive indices of between 1.7 and 1.8 are required, aluminium oxide (n=1.63) and yttrium oxide (n=1.85), for example, cannot be employed in pure form.

For this reason, there have been numerous attempts to reduce the melting point of the base materials by means of suitable additives. At the same time, the refractive index can also be set specifically through the addition of additives.

However, when selecting the materials to be added, it must be noted that only materials which have no or no significant absorption in a broad range of the radiation spectrum are suitable. Of particular importance here is freedom from absorption from the near infrared via the visible spectral region to the near UV wavelength range (up to about 200 nm). For this reason, praseodymium oxide and neodymium oxide, for example, are not suitable as additives since they have absorption maxima in this range.

However, the use of mixed systems also proves to be difficult for other reasons since mixed systems in many cases evaporate incongruently, i.e. their composition changes in the course of the evaporation process. However, the composition of the deposited layers also changes therewith. The inhomogeneous layers formed no longer have a reproducible uniform refractive index. This problem appears to an increased extent if, as generally customary, layer systems comprising a plurality of layers are applied to a substrate.

U.S. Pat. No. 3,934,961 discloses a three-layered antireflection coating whose first layer on the substrate consists of aluminium oxide and zirconium oxide. It is thus possible to set layers of medium refractive index between 1.63 and 1.75. Although layers of this type exhibit no absorption in the visible spectral region, it has been found in practice, however, that the metal oxides evaporate incongruently and thus result in inhomogeneous layers.

DE-A 42 19 817 describes a vapour-deposition material for the production of optical layers of medium refractive index which consists of a compound of the formula $La_{1-x}Al_{1+x}O_3$, where x=0 to 0.84. This compound is prepared from a mixture of lanthanum oxide and aluminium oxide. However, the lanthanum oxide content results in increased sensitivity to a moist atmosphere since lanthanum oxide takes up moisture. Just in order to minimise the associated processing problems, complex measures therefore have to be taken as early as during the preparation and later during the processing of the vapour-deposition materials. However, the layers formed are in any case unstable at increased atmospheric humidity levels. In addition, lanthanum has a natural radioactive isotope which acts as gamma emitter and can cause defects and damage to sensitive components, for example detectors, in optical layers produced from the above-mentioned compound. A further disadvantage consists in that the mixture has to be subjected to sintering temperatures of 1600° C. or higher before evaporation, which can cause damage to the equipment and apparatuses used, for example to melting crucibles and heating coils.

According to Japanese laid-open specification JP-A-2000-171609, a compound of the formula $Sm_{1-x}Al_{1+x}O_3$, where $-1<x<1$, is used for the production of layers of medium refractive index. This material does not change its composition during the evaporation, but has an absorption band due to the samarium ion at a wavelength of about 400 nm, which restricts use beyond the visible spectral region, in particular in the ultraviolet spectral region. In addition, samarium also has natural radioactive isotopes which occur with a high relative frequency of 15% and, as alpha emitters, likewise have the disadvantages already described above. In order to sinter the mixture, temperatures of about 1500° C. are necessary.

Further oxides of elements from the lanthanoid group are employed as individual substances in optical layers.

Thus, for example, U.S. Pat. No. 4,794,607 describes a semiconductor laser which can have an antireflection layer of gadolinium oxide. A thin interlayer of aluminium oxide increases the adhesion of the gadolinium oxide layer to the laser. The refractive index that can be achieved with the gadolinium oxide layer is not described.

DE-A 33 35 557 discloses a synthetic resin lens having a refractive index of about 1.6 which may comprise ytterbium oxide in a layer in a multilayered system for reflection reduction. The refractive index that can be achieved with this ytterbium oxide layer is not mentioned. Mixtures of ytterbium oxide with other materials are not described.

The object of the present invention was to provide a vapour-deposition material for the production of optical layers of medium refractive index which has high durability, is insensitive to moisture, acids and alkalis, has low radioactivity, is transparent and non-absorbent over a broad spectral range, does not change its original composition during melting and evaporation, requires only low sintering temperatures and with the aid of which layers of medium refractive index having the above-mentioned properties whose refractive index can be set specifically in the range between 1.7 and 1.8 can be obtained.

The object according to the invention is achieved by a vapour-deposition material for the production of optical layers of medium refractive index, comprising aluminium oxide and at least one compound from the group consisting of gadolinium oxide, dysprosium oxide and ytterbium oxide.

The object according to the invention is also achieved by a process for the preparation of a vapour-deposition material for the production of optical layers of medium refractive index, in which aluminium oxide is mixed with at least one compound from the group consisting of gadolinium oxide, dysprosium oxide and ytterbium oxide, the mixture is compressed or suspended, shaped and subsequently sintered.

In addition, the present invention relates to the use of a vapour-deposition material comprising aluminium oxide and at least one compound from the group consisting of gadolinium oxide, dysprosium oxide and ytterbium oxide for the production of optical layers of medium refractive index.

The vapour-deposition material according to the invention comprises aluminium oxide and at least one compound from the group consisting of gadolinium oxide ($Gd_2O_3$), dysprosium oxide ($Dy_2O_3$) and ytterbium oxide ($Yb_2O_3$). The molar composition of the mixture here determines the refractive index of the layer which can be produced by means of the vapour-deposition material. Pure aluminium oxide results in a refractive index of the layer of about 1.63. This is too low for certain applications, in which refractive indices of from 1.7 to 1.8 are necessary. The refractive indices of pure layers of gadolinium oxide, dysprosium oxide or ytterbium oxide vary, depending on the layer thickness and application method, between 1.55 and 1.85. Addition of these substances thus in most cases enables the refractive index to be increased compared with a layer of pure aluminium oxide.

The molar composition of the mixture is therefore set in accordance with the requisite refractive index. It can be varied within broad limits and is from 1:99 to 99:1 (mol %) in binary mixtures. If a plurality of compounds from the group consisting of gadolinium oxide, dysprosium oxide and ytterbium oxide is employed, each of the constituents may be present in an amount of up to 98 mol % in the case of ternary mixtures and in an amount of up to 97 mol % in the case of quaternary mixtures.

A proportion of from 20 to 80 mol % of aluminium oxide and from 80 to 20 mol % of the at least one compound from the group consisting of gadolinium oxide, dysprosium oxide and ytterbium oxide is particularly advantageous here, but in particular a ratio of from 40:60 to 60:40.

Besides reliable setting of the desired refractive index, preferably in the range between 1.7 and 1.8, this mixture also offers a not inconsiderable economic advantage over pure layers of gadolinium oxide, dysprosium oxide or ytterbium oxide since aluminium oxide is more readily available and less expensive.

The use of ternary or quaternary mixtures of aluminium oxide and gadolinium oxide and/or dysprosium oxide and/or ytterbium oxide can favour precise control of the refractive index. The variation latitude of the medium refractive indices in the range from 1.6 to 1.9 that can be set is thus increased.

Besides the possibility of being able to produce layers having refractive indices in a pre-defined range, the vapour-deposition materials according to the invention also have a number of further advantages. Although they are mixtures, they evaporate congruently, i.e. their composition remains virtually unchanged during the evaporation process. Homogeneous layers of medium refractive index can thus be produced reproducibly. This is particularly advantageous if multilayered systems with materials of different refractive indices are deposited one on top of the other. Otherwise, a considerable deviation from the system value originally calculated would arise via the number of layers of medium refractive index.

The optical layers obtained are transparent over a broad spectral range, i.e. from about 250 nm to about 7 μm, and have only extremely low absorption in this range. In particular in the visible spectral region, they are totally free from absorption. This makes them particularly interesting for use in polarising beam splitters and dichroic filters.

The vapour-deposition material according to the invention furthermore has improved durability, which has a positive effect predominantly in a moist-warm environment. Since the starting materials are stable to atmospheric humidity, they are simple to handle and particular protective measures do not have to be taken during the preparation and further processing of the vapour-deposition materials. Furthermore, the optical layers produced with these materials are distinguished by high stability in a moist-warm atmosphere and to acids and alkalis.

A further advantage of the vapour-deposition materials of the present invention consists in that the substances used have no radioactive isotopes. Neither the vapour-deposition materials themselves nor the layers produced therewith therefore emit radioactively, meaning that safety measures are unnecessary and damage in this respect to optical components or detectors which come into contact with the layers is not to be expected.

The vapour-deposition material according to the invention is prepared by a process in which aluminium oxide is mixed with at least one compound from the group consisting of gadolinium oxide, dysprosium oxide and ytterbium oxide, the mixture is compressed or suspended, shaped and subsequently sintered.

The molar mixing ratio of the starting components here is dependent on the target refractive index of the layer to be applied with the mixture and can be varied in a broad range, namely from 1:99 to 99:1 mol % in the case of binary mixtures and with a proportion of up to 98 mol % for one of the oxides in a ternary mixture and up to 97 mol % in the case of a quaternary mixture.

A proportion of from 20 to 80 mol % of aluminium oxide and from 80 to 20 mol % of the at least one compound from the group consisting of gadolinium oxide, dysprosium oxide and ytterbium oxide is particularly advantageous, but in particular a ratio of from 40:60 to 60:40.

The components are mixed intimately with one another and subsequently compressed and shaped by means of suitable compression measures known per se. However, it is also possible to prepare a suspension of the mixed components in a suitable carrier medium, which is shaped and subsequently dried. A suitable carrier medium is, for example, water, to which, if necessary, binders, such as polyvinyl alcohol, methylcellulose or polyethylene glycol, and, if desired, assistants, such as, for example, wetting agents or antifoams, are added. The suspension operation is followed by shaping. In this, various known techniques, such as extrusion, injection moulding or spray drying, can be used. The shapes obtained are dried and freed from the binder, for example by burning out. This is carried out for reasons of better handling and metering of the mixtures, which thus also become accessible to continuous vapour-deposition processes. The shapes into which the mixture is converted are therefore not limited. Suitable shapes are all those which facilitate simple handling and good metering, which play a special role, in particular, in the continuous coating of substrates with the vapour-deposition material according to the invention and the replenishment process which is necessary for this purpose. Preferred shapes are therefore various tablet shapes, pellets, discs, truncated cones, grains or granules, rods or also beads.

The shaped mixtures are subsequently sintered. The sintering process here can be carried out under various conditions. In general, the vapour-deposition material according to the invention is sintered in air. However, the sintering process can also be carried out under reduced pressure or under an inert gas, for example argon. It is particularly advantageous that the sintering temperatures required are in some cases considerably lower than for other suitable vapour-deposition materials for layers of medium refractive index from the prior art. They are from about 1300 to 1600° C. in air or under reduced pressure or under an inert gas. These comparatively low temperatures result in lower thermal load of the equipment and apparatuses, such as, for example, melting crucibles and heating coils, meaning that their life is increased.

The shaped sintered products formed remain in their shape during storage, transport and introduction into the evaporation apparatus and are stable in their composition during the entire subsequent melting and evaporation process.

After sintering and cooling, the vapour-deposition materials according to the invention are ready for use for the production of optical layers of medium refractive index having refractive indices of between 1.6 and 1.9.

The vapour-deposition materials according to the present invention can be used to coat all suitable substrates, which can consist of the known suitable materials, such as, for example, various glasses or plastics, and are in the shape of panes, prisms, sheets, shaped substrates, such as lenses, spectacle lenses, camera lenses or the like. Their nature, size, shape, material and surface quality are not limited and are restricted only by the usability of the substrates in the coating apparatus, since the substrates can be introduced into the apparatus and must remain stable under the temperature and pressure conditions prevailing therein.

It has proven advantageous to heat the substrates before and during the coating operation, so that the vapour-deposition material hits a pre-heated substrate. However, this measure is known per se from the prior art.

The vapour-deposition process employed is usually a high-vacuum vapour-deposition process in which the vapour-deposition material in a suitable flask, which is known as the evaporation crucible or evaporation boat, is introduced into a vacuum apparatus together with the substrate to be coated.

The apparatus is subsequently evacuated, and the vapour-deposition material is caused to evaporate by heating and/or electron beam bombardment. The vapour-deposition material precipitates on the substrate in the form of a thin layer.

During the evaporation, oxygen can be added in order to ensure complete oxidation of the layers. Furthermore, ion bombardment of the substrate (ion assisted deposition, plasma assisted deposition) can be carried out during the coating operation in order to increase the density of the layers and in order to improve the adhesion, in particular to unheated substrates.

A plurality of layers is frequently deposited alternately one on top of the other on the substrate. Through a suitable choice of the refractive indices of the individual layers, it is thereby possible to set specifically the desired optical properties, such as, for example, reflection reduction, reflection increase or the setting of a pre-defined refractive index for the system as a whole. However, multilayered arrangements of this type on optical substrates have been known per se for some time and are frequently used.

The vapour-deposition material according to the invention can be used to produce adherent optical layers of medium refractive index on suitable substrates which are non-absorbent in a broad spectral range, are transparent and homogeneous, have a medium refractive index in the range from about 1.6 to about 1.9, are stable in a moist-warm environment and to acids and alkalis and emit no radioactive radiation.

The invention will be explained below by means of a number of examples, but without being restricted thereto.

EXAMPLE 1

Mixture of $Al_2O_3$ and $Dy_2O_3$ 21.11 g of aluminium oxide (50 mol %) and 77.21 g of dysprosium oxide (50 mol %) are mixed intimately with one another until a homogeneous mixture has formed. This mixture is shaped into tablets, which are calcined at 1300° C. in air for 4 hours. After cooling, the tablets are introduced into the crucible of an electron-beam evaporator, for example a Leybold A700Q unit. Purified substrates of quartz glass and spectacle crown glass BK7 are introduced into the substrate holder of the unit. The unit is evacuated to a pressure of $2 \times 10^{-3}$ Pa. The substrates are heated to about 300° C. Oxygen is then admitted into the unit to a pressure of $2 \times 10^{-2}$ Pa in order to achieve complete oxidation. The tablet of the vapour-deposition material is subsequently heated to the evaporation temperature of about 2100° C., and a layer having a thickness of about 280 nm is vapour-deposited on the substrates. The layer thickness is determined using a vibrating quartz layer thickness measuring instrument. After cooling, the unit is flooded with air, and the coated substrates are removed. The transmission and reflection spectra are measured using a spectrophotometer, and the layer thickness and refractive index are calculated therefrom. The layers applied are homogeneous and have a refractive index of 1.70 at a wavelength of 500 nm. The absorption in the range from 300 to 900 nm is determined as being less than 1%.

EXAMPLE 2

Mixture of $Al_2O_3$ and $Yb_2O_3$ 20.11 g of aluminium oxide (50 mol %) and 81.57 g of ytterbium oxide (50 mol %) are mixed intimately with one another until a homogeneous mixture has formed. This mixture is shaped into tablets, which are calcined at 1300° C. in air for 4 hours. The cooled tablets are subsequently introduced into the crucible of an electron-beam evaporator, for example a Leybold A700Q vapour-deposition unit. Purified substrates of quartz glass and spectacle crown glass BK7 are introduced into the substrate holder of the unit. The unit is evacuated to a pressure of $2\times10^{-3}$ Pa. The substrates are heated to about 300° C. Oxygen is then admitted into the unit to a pressure of $2\times10^{-2}$ Pa. The tablet of the vapour-deposition material is subsequently heated to the evaporation temperature of 2100° C., and a layer having a thickness of about 280 nm is vapour-deposited on the substrates. After cooling, the unit is flooded with air, and the coated substrates are removed. The transmission and reflection spectra are measured using a spectrophotometer, and the layer thickness and refractive index are calculated therefrom. The layers applied are homogeneous and have a refractive index of 1.76 at a wavelength of 500 nm. The absorption in the range from 300 to 900 nm is determined as being less than 1%.

EXAMPLE 3

Mixture of $Al_2O_3$ and $Gd_2O_3$ 21.56 g of aluminium oxide (50 mol %) and 76.67 g of gadolinium oxide (50 mol %) are mixed intimately with one another until a homogeneous mixture has formed. This mixture is shaped into tablets, which are calcined at 130° C. in air for 4 hours. After cooling, the tablets are introduced into the crucible of an electron-beam evaporator in a Leybold A700Q vapour-deposition unit. Purified substrates of quartz glass and spectacle crown glass BK7 are introduced into the substrate holder of the unit. The unit is evacuated to a pressure of $2\times10^{-3}$ Pa. The substrates are heated to about 300° C. Oxygen is then admitted into the unit to a pressure of $2\times10^{-2}$ Pa. The tablet of the vapour-deposition material is subsequently heated to the evaporation temperature of about 2100° C., and a layer having a thickness of about 240 nm is vapour-deposited on the substrates. After cooling, the unit is flooded with air, and the coated substrates are removed. The transmission and reflection spectra are measured using a spectro-photometer, and the layer thickness and refractive index are calculated therefrom. The layers applied are homogeneous and have a refractive index of 1.71 at a wavelength of 500 nm. The absorption in the range from 300 to 900 nm is determined as being less than 1%.

EXAMPLE 4

Mixture of $Al_2O_3$ and $Yb_2O_3$ 14.46 g of aluminium oxide (40 mol %) and 83.65 g of ytterbium oxide (60 mol %) are mixed intimately with one another until a homogeneous mixture has formed. This mixture is shaped into tablets, which are calcined at 1300° C. in air for 4 hours. After cooling, the tablets are introduced into the crucible of an electron-beam evaporator in a Leybold A700Q vapour-deposition unit. Purified substrates of quartz glass and spectacle crown glass BK7 are introduced into the substrate holder of the unit. The unit is evacuated to a pressure of $2\times10^{-3}$ Pa. The substrates are heated to about 300° C. Oxygen is then admitted into the unit to a pressure of $2\times10^{-2}$ Pa. The tablet of the vapour-deposition material is subsequently heated to the evaporation temperature of about 2100° C., and a layer having a thickness of about 240 nm is vapour-deposited on the substrates. After cooling, the unit is flooded with air, and the coated substrates are removed. The transmission and reflection spectra are measured using a spectrophotometer, and the layer thickness and refractive index are calculated therefrom. The layers applied are homogeneous and have a refractive index of 1.80 at a wavelength of 500 nm. The absorption in the range from 300 to 900 nm is determined as being less than 1%.

EXAMPLE 5

Mixture of $Al_2O_3$, $Dy_2O_3$ and $Gd_2O_3$ 21.7% by weight (50 mol %) of aluminium oxide, 39.69% by weight (25 mol %) of dysprosium oxide and 38.57% by weight (25 mol %) of gadolinium oxide are mixed intimately with one another until a homogeneous mixture has formed. This mixture is shaped into tablets, which are calcined at 1500° C. in air for 4 hours. After cooling, the tablets are introduced into the crucible of an electron-beam evaporator in a Leybold L560 vapour-deposition unit. Purified substrates of quartz glass and spectacle crown glass BK7 are introduced into the substrate holder of the unit. The unit is evacuated to a pressure of $2\times10^{-3}$ Pa. The substrates are heated to about 250° C. Oxygen is then admitted into the unit to a pressure of $2\times10^{-2}$ Pa. The tablet of the vapour-deposition material is subsequently heated to the evaporation temperature of about 2100° C., and a layer having a thickness of about 270 nm is vapour-deposited on the substrates. After cooling, the unit is flooded with air, and the coated substrates are removed. The transmission and reflection spectra are measured using a spectrophotometer, and the layer thickness and refractive index are calculated therefrom. The layers applied are homogeneous and have a refractive index of 1.72 at a wavelength of 500 nm. The absorption in the range from 300 to 900 nm is determined as being less than 1%.

EXAMPLE 6

Mixture of $Al_2O_3$, $Dy_2O_3$, $Gd_2O_3$ and $Yb_2O_3$ 21.31% by weight (50 mol %) of aluminium oxide, 25.97% by weight (16.66 mol %) of dysprosium oxide, 25.42% by weight (16.66 mol %) of gadolinium oxide and 27.47% by weight (16.68 mol %) of ytterbium oxide are mixed intimately with one another until a homogeneous mixture has formed. This mixture is shaped into tablets, which are calcined at 1500° C. in air for 6 hours. After cooling, the tablets are introduced into the crucible of an electron-beam evaporator in a Leybold L560 vapour-deposition unit. Purified substrates of quartz glass and spectacle crown glass BK7 are introduced into the substrate holder of the unit. The unit is evacuated to a pressure of $2\times10^{-3}$ Pa. The substrates are heated to about 250° C. Oxygen is then admitted into the unit to a pressure of $2\times10^{-2}$ Pa. The tablet of the vapour-deposition material is subsequently heated to the evaporation temperature of about 2100° C., and a layer having a thickness of about 290 nm is vapour-deposited on the substrates. After cooling, the unit is flooded with air, and the coated substrates are removed. The transmission and reflection spectra are measured using a spectrophotometer, and the layer thickness and refractive index are calculated therefrom. The layers applied are homogeneous and have a refractive index of 1.73 at a wavelength of 500 nm. The absorption in the range from 300 to 900 nm is determined as being less than 1%.

Durability Test

The coated substrates obtained in Examples 1 to 4 were subjected to various durability tests. In these, the substrates were stored in various media under various conditions.

| Storage in: | Condition: |
|---|---|
| Deionised water | 6 hours at room temperature |
| Boiling deionised water | 10 minutes |
| Saline solution | 4.5% by weight in deionised water, 6 hours, room temperature |
| Hydrochloric acid solution | 0.01 molar, 6 hours at room temperature (pH 2) |
| Sodium hydroxide solution | 0.01 molar, 6 hours at room temperature (pH 12) |

Results: detachment of the applied layer is not observed in any of the sample glasses after the respective test. Spots and/or hazing are not evident.

Analysis of the Transmission and Reflection Spectra:

For the coated substrates obtained in Examples 1 to 4 and a comparative sample consisting of a quartz substrate coated with $Al_2O_3$, the transmission and reflection spectra were determined after the above-mentioned durability tests and assessed in comparison with the transmission and reflection spectra of the untested substrates. The following results were obtained:

| | Substance | | | |
|---|---|---|---|---|
| Test | $Al_2O_3/Yb_2O_3$ | $Al_2O_3/Dy_2O_3$ | $Al_2O_3/Gd_2O_3$ | $Al_2O_3$ |
| Deionised water | + | + | + | + |
| Boiling test | + | + | + | − |
| NaCl solution | + | + | + | + |
| HCl solution | − | + | ? | ? |
| NaOH solution | + | + | + | − |

+ spectra unchanged
− spectra considerably changed
? spectra somewhat changed

According to these results, layers of $Al_2O_3/Dy_2O_3$ exhibit the best results with respect to their mechanical durability and the variability of the spectra after exposure to a moist-warm environment or to acids and alkalis. In particular, they are more durable than layers of pure $Al_2O_3$. The layers comprising ytterbium oxide and gadolinium oxide components are somewhat less durable than the layers of $Al_2O_3/Dy_2O_3$, but significantly better than layers of pure $Al_2O_3$.

The invention claimed is:

1. A material for the production of optical layers of medium refractive index, consisting of aluminum oxide and at least two of gadolinium oxide, dysprosium oxide and ytterbium oxide, which material is functional as a vapor-deposition material.

2. The material according to claim 1, consisting of aluminum oxide, gadolinium oxide, dysprosium oxide and ytterbium oxide.

3. The material according to claim 1, consisting of (i) aluminum oxide and (ii) two of gadolinium oxide, dysprosium oxide and ytterbium oxide in a ratio of i/ii from 1:99 to 99:1 mol %.

4. The material according to claim 1, consisting of 20 to 80 mol % of aluminum oxide and 80 to 20 mol % of at least two of gadolinium oxide, dysprosium oxide and ytterbium oxide.

5. A process for the preparation of a vapor-deposition material according to claim 1, comprising mixing aluminum oxide with at least two of gadolinium oxide, dysprosium oxide and ytterbium oxide, compressing or suspending the mixture, shaping the mixture and subsequently sintering.

6. The process according to claim 5, in which aluminum oxide and (ii) at least two of gadolinium oxide, dysprosium oxide and ytterbium oxide are mixed in a ratio of i/ii from 1:99 to 99:1 mol %.

7. The process according to claim 5, comprising mixing aluminum oxide with dysprosium oxide.

8. The process according to claim 5, in which the sintering is carried out at a temperature of 1300 to 1600° C. with inflow of air.

9. The process according to claim 5, in which the sintering is carried out at a temperature of 1300 to 1600° C. under reduced pressure or under an inert gas.

10. The process according to claim 5, in which the mixture is shaped into tablets, pellets, discs, truncated cones, grains, granules, rods or beads.

11. A method for the production of optical layers of medium refractive index, comprising depositing by vapour deposition on a glass or plastic substrate, a material according to claim 1.

12. An optical layer of medium refractive index on a glass or plastic substrate, having a refractive index of 1.6 to 1.9, said layer comprising a vapour-deposition material according to claim 1.

13. An optical system comprising a glass or plastic substrate and thereon at least one optical layer of medium refractive index having a refractive index of 1.6 to 1.9, comprising a material according to claim 1.

14. An optical layer of medium refractive index on a glass or plastic substrate, having a refractive index of 1.6 to 1.9, said layer comprising a vapour-deposition material comprising aluminium oxide and at least one of gadolinium oxide, dysprosium oxide and ytterbium oxide.

15. An optical system comprising a glass or plastic substrate and thereon at least one optical layer of medium refractive index having a refractive index of 1.6 to 1.9, said layer comprising a vapour-deposition material comprising aluminium oxide and at least one of gadolinium oxide, dysprosium oxide and ytterbium oxide.

16. An optical layer of medium refractive index on a glass or plastic substrate, having a refractive index of 1.6 to 1.9, said layer consisting of, as a vapour-deposition material, aluminium oxide and at least one of gadolinium oxide, dysprosium oxide and ytterbium oxide.

17. A multilayered optical system comprising, as at least one optical layer, a medium refractive index layer having a refractive index of 1.6 to 1.9, said layer consisting of, as a vapour-deposition material, aluminium oxide and at least one of gadolinium oxide, dysprosium oxide and ytterbium oxide.

* * * * *